United States Patent
Shimamura et al.

(10) Patent No.: US 9,515,130 B2
(45) Date of Patent: Dec. 6, 2016

(54) COVERING METHOD AND ORGANIC EL ELEMENT MANUFACTURING METHOD

(71) Applicant: PANASONIC CORPORATION, Osaka (JP)

(72) Inventors: Takayuki Shimamura, Hyogo (JP); Asaki Sano, Hyogo (JP); Hideaki Matsushima, Hyogo (JP); Nobuyuki Ishikura, Hyogo (JP)

(73) Assignee: JOLED INC., Tokyo (JP)

( * ) Notice: Subject to any disclaimer, the term of this patent is extended or adjusted under 35 U.S.C. 154(b) by 1 day.

(21) Appl. No.: 14/407,202

(22) PCT Filed: Jun. 20, 2013

(86) PCT No.: PCT/JP2013/003838
§ 371 (c)(1),
(2) Date: Dec. 11, 2014

(87) PCT Pub. No.: WO2013/190841
PCT Pub. Date: Dec. 27, 2013

(65) Prior Publication Data
US 2015/0221709 A1  Aug. 6, 2015

(30) Foreign Application Priority Data
Jun. 21, 2012 (JP) .................................. 2012-139619

(51) Int. Cl.
*H01L 27/32* (2006.01)
*H01L 21/66* (2006.01)
(Continued)

(52) U.S. Cl.
CPC ........... *H01L 27/3258* (2013.01); *H01L 22/20* (2013.01); *H01L 22/26* (2013.01); *H01L 27/3244* (2013.01);
(Continued)

(58) Field of Classification Search
CPC ............. H01L 27/3258; H01L 27/3244; H01L 2251/568; G02F 1/136259
See application file for complete search history.

(56) References Cited

U.S. PATENT DOCUMENTS 5,443,922 A    8/1995  Nishizaki et al.
2002/0180926 A1* 12/2002  Mizumura ........ G02F 1/136259
                                                        349/192
(Continued)

FOREIGN PATENT DOCUMENTS

JP    05-163488       6/1993
JP    2004-253214     9/2004
(Continued)

OTHER PUBLICATIONS

International Search Report (ISR) in International Patent Application No. PCT/JP2013/003838, dated Sep. 24, 2013.

*Primary Examiner* — Stephen W Smoot
*Assistant Examiner* — Sun M Kim
(74) *Attorney, Agent, or Firm* — Greenblum & Bernstein, P.L.C.

(57) ABSTRACT

A covering method including: preparing a mixture containing insulative material and a solvent; applying the mixture over a defective portion; and covering the defective portion with the insulative material by causing the solvent to evaporate from the mixture. In the covering method, the solvent has a boiling point no lower than 178 degrees Celsius, and in the mixture, a weight ratio percentage of the insulative material to the solvent is no lower than 10%. Thus, the defective portion, which may result in a dark spot, can be efficiently covered with insulative material while ensuring that a non-light-emission area that is formed accordingly has the smallest-necessary size and that sufficient insulation is achieved.

9 Claims, 10 Drawing Sheets

(51) Int. Cl.
*H01L 51/52* (2006.01)
*H01L 51/56* (2006.01)

(52) U.S. Cl.
CPC ........ *H01L 51/5253* (2013.01); *H01L 51/56* (2013.01); *H01L 2251/568* (2013.01)

(56) References Cited

U.S. PATENT DOCUMENTS

| | | | |
|---|---|---|---|
| 2006/0197440 A1* | 9/2006 | Mitsui | H01L 27/3244 |
| | | | 313/504 |
| 2014/0008627 A1 | 1/2014 | Hiraoka et al. | |
| 2014/0154818 A1 | 6/2014 | Shimamura et al. | |
| 2014/0209891 A1 | 7/2014 | Hiraoka et al. | |

FOREIGN PATENT DOCUMENTS

| | | | |
|---|---|---|---|
| JP | 2004253214 A | * | 9/2004 |
| JP | 2007-086419 | | 4/2007 |
| JP | 2011-033689 | | 2/2011 |
| JP | 2011-108369 | | 6/2011 |
| JP | 2012-099328 | | 5/2012 |
| JP | 2013-016342 | | 1/2013 |

\* cited by examiner

| Insulative material | Solid content (%) | Boiling point (°C) | Total evaluation | Stability | Film thickness | Application area |
|---|---|---|---|---|---|---|
| 1 | 5 | 178 | ◆ | 15 h (○) | 17 nm (◆) | 65 μm (◆) |
| 2 | 5 | 162 | ◆ | 12 h (○) | 24 nm (◆) | 55 μm (○) |
| 3 | 10 | 194 | ◆ | 15 h (○) | 23 nm (◆) | 65 μm (◆) |
| 4 | 10 | 178 | ○ | 15 h (○) | 46 nm (○) | 55 μm (○) |
| 5 | 10 | 162 | ◆ | 2 h (◆) | 77 nm (○) | 48 μm (○) |
| 6 | 20 | 210 | ○ | 70 h (○) | 60 nm (○) | 55 μm (○) |
| 7 | 20 | 194 | ○ | 50 h (○) | 100 nm (○) | 55 μm (○) |
| 8 | 20 | 178 | ○ | 15 h (○) | 140 nm (○) | 55 μm (○) |
| 9 | 30 | 210 | ○ | 70 h (○) | 130 nm (○) | 55 μm (○) |
| 10 | 30 | 194 | ○ | 70 h (○) | 240 nm (○) | 50 μm (○) |
| 11 | 30 | 178 | ◆ | 10 h (◆) | 440 nm (○) | 50 μm (○) |
| 12 | 40 | 210 | ○ | 30 h (○) | 600 nm (○) | 50 μm (○) |
| 13 | 40 | 194 | ○ | 70 h (○) | 790 nm (○) | 50 μm (○) |

○: Satisfactory    ◆: Unsatisfactory

COVERING METHOD AND ORGANIC EL ELEMENT MANUFACTURING METHOD

TECHNICAL FIELD

The present disclosure relates to a covering method of covering a defective portion of an organic electro-luminescence (EL) element, and a manufacturing method of manufacturing an organic EL element.

BACKGROUND ART

Recently, organic EL display panels are gaining popularity as display devices. A typical organic EL display panel includes a substrate and organic EL elements disposed on the substrate. An organic EL display panel realizes high visibility and high shock resistance, because the organic EL elements included therein have high visibility for being self-luminescent and have high shock resistance for having a fully solid-state structure.

An organic EL element is a current-driven light-emission element. An organic EL element typically includes an electrode pair composed of a pixel electrode and a common electrode, and a plurality of functional layers that are layered between the pixel electrode and the common electrode. The functional layers include a light-emission layer that emits light by utilizing electro-luminescence occurring when carriers (holes and electrons) recombine therein.

In the manufacturing of an organic EL display panel, a foreign particle of extremely small size, such as dust, may adhere to a surface of an electrode or a functional layer. Also, resist defect may result in an electrode or a functional layer having a surface with local level unevenness. When a functional layer is formed above the substrate/functional layer in such a state, the functional layer above the electrode/functional layer may have relatively small thickness at a certain area thereof. Further, there may even be cases where the functional layer above the electrode/functional layer is not formed at a certain area. Here, an area of an organic EL element of an organic EL display panel where a functional layer has relatively small thickness compared to other areas or where a functional layer is not formed, is referred to as a defective area. Such a defective area may result in forming of a bright spot, and may ultimately result in forming of a dark spot in the course of time. A bright spot is an organic EL element having higher brightness than other organic EL elements, and is formed by current flowing in a concentrated manner through the defective area. A dark spot is an organic EL element whose light-emission layer has lost its ability to emit light due to a short circuit being formed between the pixel electrode and the common electrode. A bright spot becomes a dark spot in the course of time because current flows through the defective area (i.e., the bright spot) in a concentrated manner and the degradation of the defective area is accelerated.

In view of such problems, there is a conventional technology of preventing the occurrence of a dark spot by forming an insulative film on the defective area and thereby suppressing the flow of current through the defective area. In specific, the insulative film is formed by applying electrically non-conductive (i.e., electrically insulative) material in a fluid state over the defective area. Patent Literature 1 discloses one example of such technology.

Further, one conventional method suitable for forming such an insulative film with respect to the defective area, which typically has an extremely small size of around 0.5 to 10 μm, is needle application. Patent Literatures 1 and 2 disclose examples of needle application.

CITATION LIST

Patent Literature

[Patent Literature 1]
Japanese Patent Application Publication No. 2011-108369
[Patent Literature 2]
Japanese Patent Application Publication No. 2011-033689

SUMMARY

Technical Problem

When an insulative film as described above is formed at a specific portion of an organic EL element, the portion no longer conducts current and thus is deprived of its ability to emit light. Thus, it is plausible that the insulative film be formed to cover as small an area as possible. Further, it is plausible that the insulative film have a level of thickness sufficient to achieve insulation. Further in addition, it is plausible that the insulative film be formed by using a material having a high level of stability, or that is, a material whose viscosity changes only by a small degree in the course of time while not giving rise to phenomena such as stringing.

In view of such technical problems, the present disclosure aims to provide a covering method suitable for covering a defective portion of an organic EL element with insulative material.

Solution to the Problems

One aspect of the present disclosure is a covering method of covering a defective portion of a body having a layer structure with insulative material, the covering method including: preparing a mixture containing the insulative material and a solvent; applying the mixture over the defective portion; and covering the defective portion with the insulative material by causing the solvent to evaporate from the mixture. In the covering method pertaining to one aspect of the present disclosure, the solvent has a boiling point no lower than 178 degrees Celsius, and in the mixture, a weight ratio percentage of the insulative material to the solvent is no lower than 10%.

Advantageous Effects of the Invention

The covering method pertaining to one aspect of the present disclosure involves the use of a solvent that has a high boiling point and thus does not evaporate easily. Due to this, the viscosity of the mixture increases only by a small degree in the course of time, and thus the mixture has high stability. Further, the high concentration of solid content in the mixture provides the mixture with high viscosity. Due to this, the mixture, when applied with respect to the defective portion, does not spread easily. As such, the covering method pertaining to one aspect of the present disclosure prevents the insulative film from spreading and covering an unnecessarily large area, and thus, prevents an unnecessary increase in a non-light-emission area. In addition, the covering method pertaining to one aspect of the present disclosure, due to involving the use of a mixture that does not spread easily, prevents the insulative film from being formed to have an unnecessarily small thickness, and thus ensures that the insulative film achieve a sufficient level of insulation.

DESCRIPTION OF EMBODIMENTS

<<Overview of Aspects of Present Disclosure>>

Figure 1:
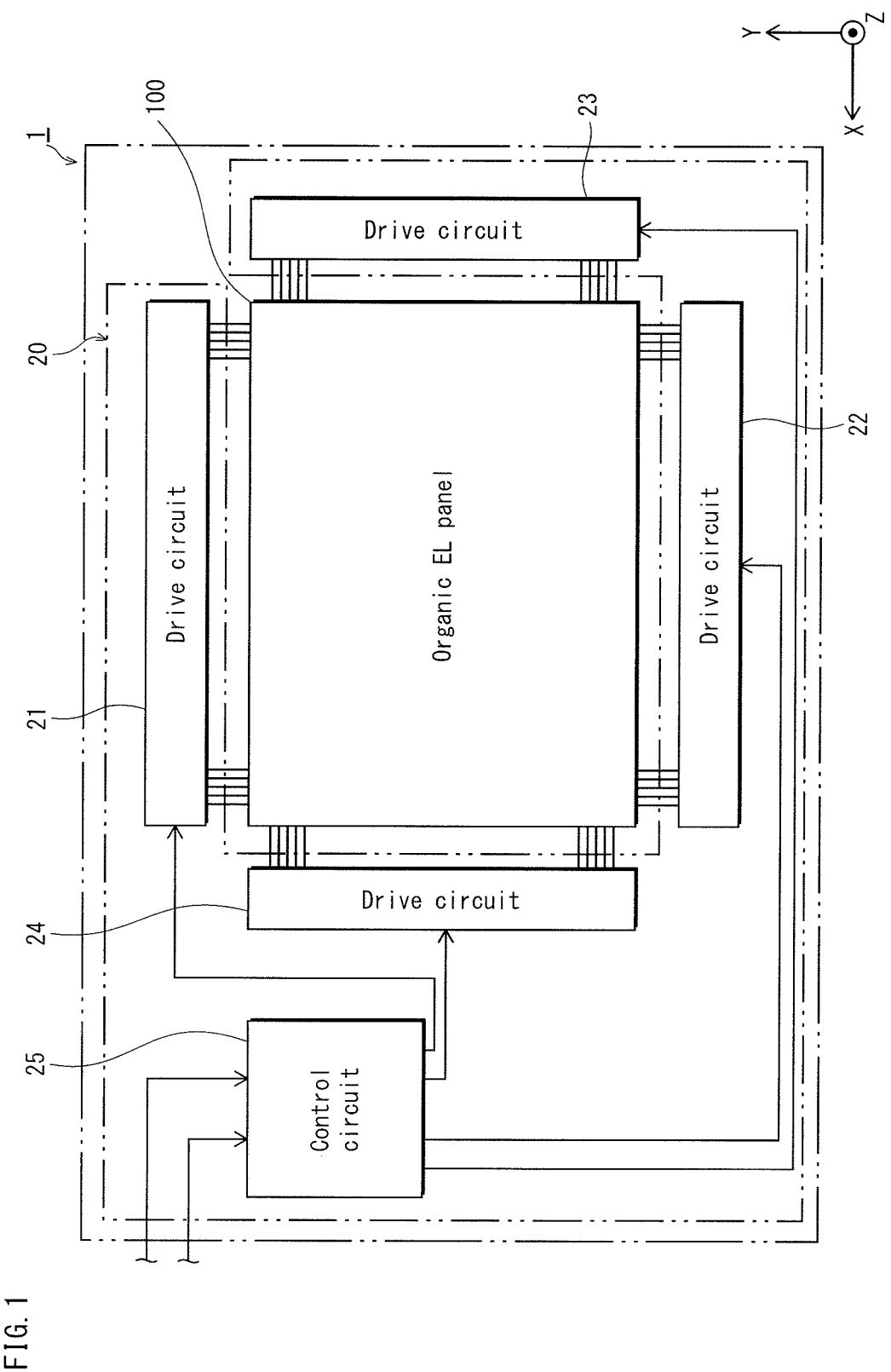
FIG. 1 is a schematic block diagram illustrating structure of display device pertaining to embodiment 1.

One aspect of the present disclosure is a covering method of covering a defective portion of a body having a layer structure with insulative material, the covering method including: preparing a mixture containing the insulative material and a solvent; applying the mixture over the defective portion; and covering the defective portion with the insulative material by causing the solvent to evaporate from the mixture. In the covering method pertaining to one aspect of the present disclosure, the solvent has a boiling point no lower than 178 degrees Celsius, and in the mixture, a weight ratio percentage of the insulative material to the solvent is no lower than 10%.

The covering method pertaining to one aspect of the present disclosure involves the use of a solvent that has a high boiling point and thus does not evaporate easily. Due to this, the viscosity of the mixture increases only by a small degree over time, and thus the mixture has high stability. Further, the high concentration of solid content in the mixture provides the mixture with high viscosity. Due to this, the mixture, when applied with respect to the defective portion, does not spread easily. As such, the covering method pertaining to one aspect of the present disclosure prevents the insulative film from spreading and covering an unnecessarily large area, and thus, prevents an unnecessary increase in a non-light-emission area. In addition, the covering method pertaining to one aspect of the present disclosure, due to involving the use of a mixture that does not spread easily, prevents the insulative film from being formed to have an unnecessarily small thickness, and thus ensures that the insulative film achieve a sufficient level of insulation.

In the covering method pertaining to one aspect of the present disclosure, the boiling point of the solvent may be equal to or lower than 210 degrees Celsius, and the weight ratio percentage of the insulative material to the solvent may be equal to or lower than 40%.

In the covering method pertaining to one aspect of the present disclosure, given x denoting the weight ratio percentage of the insulative material to the solvent and y denoting the boiling point of the solvent in centigrade, x and y may satisfy $10 \leq x \leq 20$, $178 \leq y \leq 210$, $y \leq 3.2x+146$, and $y \geq 0.97x+20.5$ in the mixture.

In the covering method pertaining to one aspect of the present disclosure, in the preparation of the mixture, the mixture may be loaded to a container having an opening, and in the application of the mixture, after inserting an application member having a bar shape into the container through the opening, a tip portion of the application member may be put in contact with the defective portion to apply the mixture with respect to the defective portion, the mixture adhering to the tip portion of the application member when the application member is inserted into the container through the opening.

In the covering method pertaining to one aspect of the present disclosure, the body having the layer structure may be an organic EL element including: a base substrate; a pixel electrode disposed on the base substrate; two or more functional layers disposed on or above the pixel electrode; and a common electrode disposed on or above the functional layers, and the defective portion may be either a foreign particle located between the pixel electrode and the common electrode, or an upward or downward protrusion of: the pixel electrode; one or more of the functional layers; or the pixel electrode and one or more of the functional layers.

One aspect of the present disclosure is a manufacturing method of manufacturing an organic EL element that includes: a base substrate; a pixel electrode disposed on the base substrate; two or more functional layers disposed on or above the pixel electrode; and a common electrode disposed on or above the functional layers, the manufacturing method including: detecting a defective portion, the detection performed at any point after the pixel electrode has been formed and before the common electrode is formed; and covering a defective portion detected through the detection with insulative material, the covering performed before forming a subsequent one of the functional layers or before forming the common electrode. In the manufacturing method pertaining to one aspect of the present disclosure, the covering includes: preparing a mixture containing the insulative material and a solvent; applying the mixture over the defective portion; and covering the defective portion with the insulative material by causing the solvent to evaporate from the mixture, and the solvent has a boiling point no lower than 178 degrees Celsius, and in the mixture, a weight ratio percentage of the insulative material to the solvent is no lower than 10%.

In the manufacturing method pertaining to one aspect of the present disclosure, the defective portion may be located on the pixel electrode.

Embodiment 1

1.1 Overall Structure

FIG. 1 is a schematic block diagram illustrating a structure of an organic EL display device 1. The organic EL display device 1 includes an organic EL display panel 100 pertaining to embodiment 1. As illustrated in FIG. 1, the organic EL display device 1 includes the organic EL display panel 100 and a drive/control unit 20 connected to the organic EL display panel 100. The organic EL display panel 100 is a panel utilizing electro-luminescence occurring in organic material. The organic EL display panel 100 includes a plurality of organic EL elements 10 (illustrated in FIGS. 2 and 3) that are disposed on a substrate and arranged, for example, to form a matrix. The drive/control unit 20 includes four drive circuits, namely drive circuits 21 through 24, and a control circuit 25.

Note that when the organic EL display device 1 is actually implemented, the arrangement of the drive/control unit 20 with respect to the organic EL display panel 100 may differ from that illustrated in FIG. 1.

1.2 Structure of Organic EL Display Panel

In the following, description is provided on a structure of the organic EL display panel 100, with reference to FIG. 2.

Figure 2:
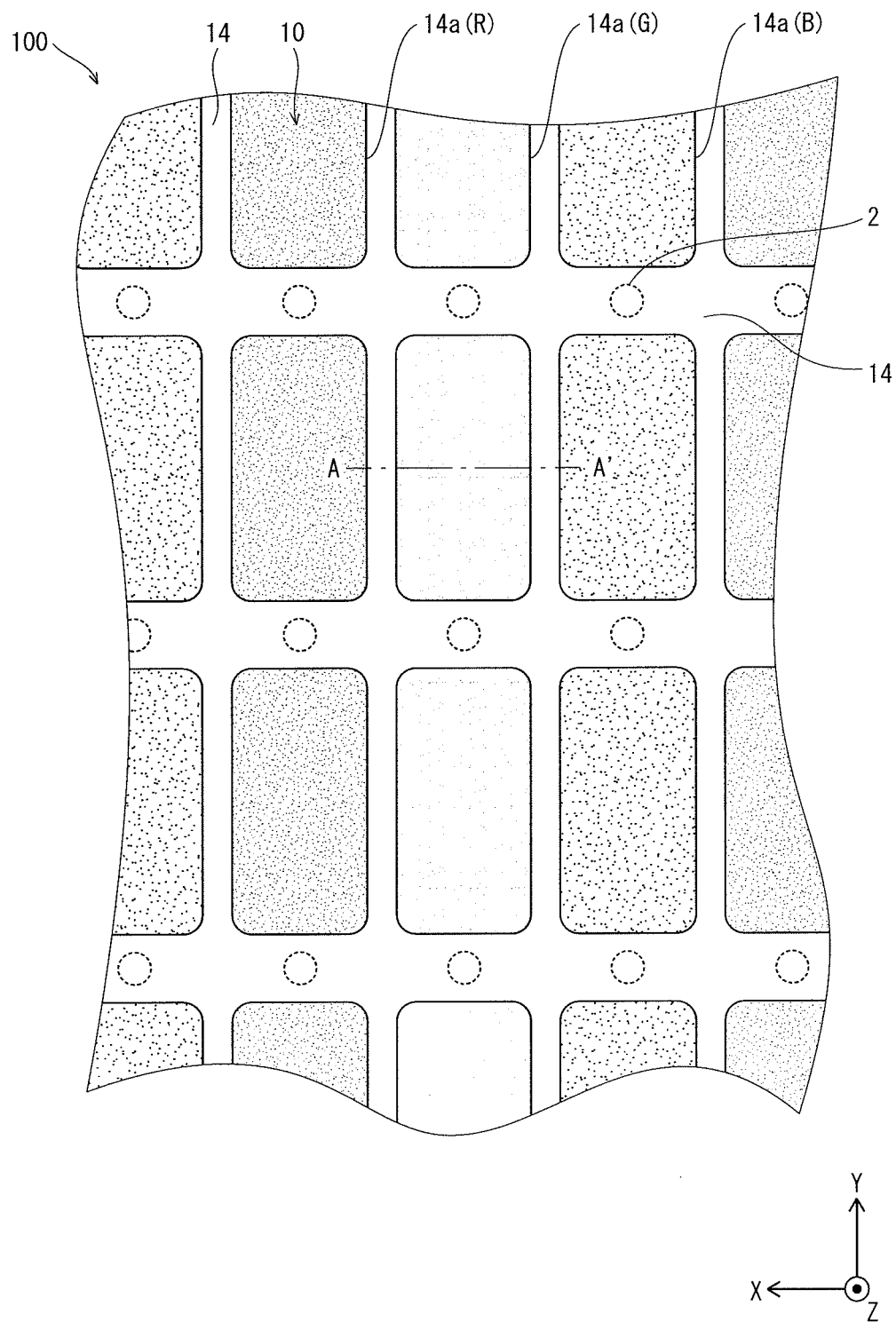
FIG. 2 is a schematic plan view of pixels of organic EL display panel pertaining to embodiment 1.
Figure 3:
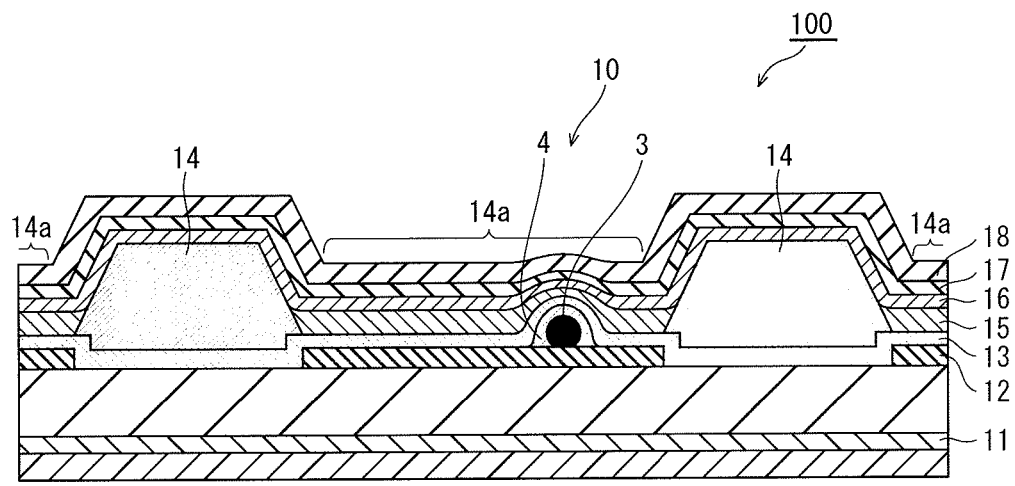
FIG. 3 is a cross-sectional view, taken along straight line A-A' in FIG. 2, schematically illustrating overall structure of organic EL element pertaining to embodiment 1.
Figure 3:
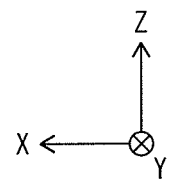

FIG. 2 is a plan view schematically illustrating an overall structure of the organic EL display panel 100 when seen from a display surface side. FIG. 3 is a partially enlarged cross-sectional view of the organic EL display panel 100, taken along the straight line A-A' in FIG. 2. Note that the display surface of the organic EL display panel 100 is located in the Z direction in FIG. 3, and thus, the organic EL display panel 100 is a so-called top-emission type organic EL display panel.

As illustrated in FIG. 3, the organic EL display panel 100, includes as main components thereof: a base substrate 11; pixel electrodes 12; a hole injection layer 13; a bank 14; organic light-emission layers 15; an electron transport layer 16; a common electrode 17; and a sealing layer 18. Specifically, each sub-pixel (organic EL element 10) of the organic EL display panel 100 includes an organic light-emission layer 15 of a corresponding one of the colors red (R), green (G), and blue (B). Further, a plurality of such sub-pixels are disposed so as to form a matrix, as illustrated in FIG. 2. Note that the electron transport layer 16, the common electrode 17, and the sealing layer 18 are not illustrated in FIG. 2 to simplify the illustration.

In addition, note that the organic EL display panel 100 has a defective portion 3 at the hole injection layer 13.

<Base Substrate>

The base substrate 100 includes a substrate main part 11a, a thin film transistor (TFT) layer 11b, and an interlayer insulative layer 11c.

The substrate main part 11a is the basis of the organic EL display panel 100. The substrate main part 11a contains insulative material such as alkali-free glass, soda glass, nonfluorescent glass, phosphate glass, borate glass, quartz, acrylic resin, styrenic resin, polycarbonate resin, epoxy resin, polyethylene, polyester, silicone resin, or alumina.

The TFT layer 11b is disposed on the surface of the substrate main part 11a. The TFT layer 11b includes, for each sub-pixel of the organic EL display panel 100, a pixel circuit including a thin film transistor element.

The interlayer insulative layer 11c is disposed on the TFT layer 11b. The interlayer insulative layer 11c ensures electrical insulation between the TFT layer 11b and the pixel electrodes 12, as well as planarizing level unevenness of the upper surface of the TFT layer 11b. The interlayer insulative layer 11c contains organic insulative material such as polyimide resin, acrylic resin, or novolac-type phenolic resin, or inorganic insulative material such as silicon oxide (SiO) or silicon nitride (SiN).

<Pixel Electrode>

One pixel electrode 12 is provided for each sub-pixel of the organic EL display panel 100. The pixel electrodes 12 contain light-reflective electrically-conductive material, such as silver (Ag), aluminum (Al), aluminum alloy, molybdenum (Mo), APC (alloy of silver, palladium, and copper), ARA (alloy of silver, rubidium, and gold), MoCr (alloy of molybdenum and chromium), MoW (alloy of molybdenum and tungsten), NiCr (alloy of nickel and chromium), or ACL (alloy of aluminum, cobalt, germanium, and lanthanum). In the present embodiment, each pixel electrode 12 is an anode.

Note that a conventional light-transmissive electrically-conductive film may be additionally disposed on the surface of each pixel electrode 12. The light-transmissive electrically-conductive film may contain, for example, indium tin oxide (ITO) or indium zinc oxide (IZO). Such a light-transmissive electrically-conductive film disposed between each pixel electrode 12 and the hole injection layer 13 improves the bonding between layers.

<Hole Injection Layer>

The hole injection layer 13 contains, for example, an oxide such as an oxide of silver (Ag), an oxide of molybdenum (Mo), an oxide of chromium (Cr), an oxide of vanadium (V), an oxide of tungsten (W), an oxide of nickel (Ni), or an oxide of Iridium (Ir), or electrically-conductive polymer material such as PEDOT (a mixture of polythiophene and polystyrene sulfonate). In particular, the hole injection layer 13, when made of a metal oxide, has a function of injecting and transporting holes into the organic light-emission layers 15 while stably generating holes or assisting the generation of holes.

Further, the hole injection layer 13, when made of an oxide of a transition metal, has multiple energy levels due to oxides of transition metals having multiple oxidation states. This results in the hole injection layer 13 readily performing hole injection and thus allows for reduction of driving voltage of the organic EL display panel 100.

<Bank>

The bank 14 is disposed on the surface of the hole injection layer 13. The bank 14 defines openings 14a, in each of which one organic light-emission layer 15 is to be formed. The bank 14 is formed such that different portions thereof have the same trapezoidal cross-sectional shape, and contains insulative organic material (for example, acrylic resin, polyimide resin, or novolac-type phenolic resin). When the organic light-emission layer 15 is formed through application of ink, the bank 14 functions as a structure that prevents the ink from flowing outside. Meanwhile, when the organic light-emission layer 15 is formed through deposition of material, the bank 14 functions as a structure on which a deposition mask can be placed.

Further, the openings 14a defined by the bank 14 correspond one-to-one with light-emission areas of the organic EL display panel 100, each of which corresponding to one sub-pixel.

<Organic Light-Emission Layer>

The organic light-emission layers 15 emit light by carriers (holes and electrons) recombining therein. Further, the organic light-emission layers 15 each contain organic material corresponding to one of the colors R, G, and B. Each organic light-emission layer 15 is formed within a corresponding one of the openings 14a defined by the bank 14. Due to this, one organic light-emission layer 15 is formed for each sub-pixel of the organic EL display panel 100.

Examples of material usable for forming the organic light-emission layers 15 include poly(para-phenylenevinylene) (PPV) and polyfluorene. Other examples of material usable for forming the organic light-emission layers 15 include: a fluorescent material such as an oxinoid compound, perylene compound, coumarin compound, azacoumarin compound, oxazole compound, oxadiazole compound, perinone compound, pyrrolo-pyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylene pyran compound, dicyanomethylene thiopyran compound, fluorescein compound, pyrylium compound, thiapyrylium compound, selenapyrylium compound, telluropyrylium compound, aromatic aldadiene compound, oligophenylene compound, thioxanthene compound, cyanine compound, acridine compound, metal complex of a 8-hydroxyquinoline compound, metal complex of a 2-bipyridine compound, complex of a Schiff base and a group three metal, metal complex of oxine, rare earth metal complex, etc., as recited in Japanese Patent Application Publication No. H5-163488.

<Electron Transport Layer>

The electron transport layer 16 has the function of transporting, to the organic light-emission layers 15, electrons injected thereto from the common electrode 17. The electron transport layer 16 contains, for example, an oxadiazole derivative (OXD), a triazole derivative (TAZ), or a phenanthroline derivative (e.g., BCP, Bphen).

<Common Electrode>

The common electrode 17 extends across the plurality of sub-pixels of the organic EL display panel 100. The common electrode 17 contains light-transmissive material that is electrically conductive, such as ITO or IZO. In a top-emission type organic EL display panel, it is plausible to form the common electrode 17 by using light-transmissive material.

Examples of materials other than those described above that may be used to form the common electrode 17 include alkaline metals and alkaline earth metals. Alternatively, the common electrode 17 may have a multilayer structure including, layered in the stated order, a layer containing a halide of an alkaline metal or an alkaline earth metal, and a layer containing silver. When the common electrode 17 has a multilayer structure as described above, the layer containing silver may be made of only silver or may be made of an alloy of silver. In addition, when the common electrode 17 has a multilayer structure as described above, a refractive index adjustment layer having high light transmissivity may be disposed above the layer containing silver.

Note that in the present embodiment, the common electrode 17 is a cathode.

<Sealing Layer 18>

The sealing layer 18 is a layer for protecting the hole injection layer 13, the organic light-emission layers 15, the electron transport layer 16, and the common electrode 17 from moisture and/or oxygen entering the organic EL display panel 100.

Note that although not illustrated in FIG. 3, black matrixes, color filters, etc., may be disposed above the sealing layer 18.

<Defective Portion>

In the present disclosure, the defective portion 3 is located between a pixel electrode 12 and the common electrode 17, and is either a foreign particle, an upward protrusion, or a downward protrusion. Due to the organic EL display panel 100 having the defective portion 3, a corresponding portion (a portion located above the defective portion 3) of each of the layers above the defective portion 3 either protrudes upwards (towards the Z direction in FIG. 3) or protrudes downwards (towards a direction opposite the Z direction in FIG. 3). Further, there may even be cases where, in one or more of the layers formed above the defective portion 3, a part of a portion corresponding to the defective portion 3 is missing.

In the present embodiment, the defective potion 3 is a foreign particle located on a pixel electrode 12, or more specifically, a foreign particle having an extremely small size, such as dust, located on a pixel electrode 12.

Here, it should be noted that the defective portion 3 may be formed between a pixel electrode 12 and the common electrode 17 due to a foreign particle or an upward or downward protrusion located lower in the organic EL display panel 100 than the pixel electrode 12. For example, when forming of the pixel electrodes 12 is performed with a foreign particle on the interlayer insulative layer 11c, a portion of a pixel electrode 12 disposed above the foreign particle may protrude upwards. In such a case the upward protrusion of the pixel electrode 12 correspond to the defective portion 3.

Accordingly, in the present disclosure, the defective portion 3 may be an upward or downward protrusion formed between a pixel electrode 12 and the common electrode 17 that derives from an element existing lower in the organic EL display panel 100 than the pixel electrodes 12. Further, in the present disclosure, when the defective portion 3 is referred to as being located between a pixel electrode 12 and the common electrode 17, the defective portion 3 may be located at the surface of the pixel electrode 12.

<Insulative Film>

The insulative film 4 contains insulative material, and covers the defective portion 3. The insulative film 4 is formed by applying the insulative material over the defective portion 3 and the pixel electrode 12 corresponding to the defective portion 3. The insulative film 4 prevents current from flowing between the pixel electrode 12 and the common electrode 17 at the portion corresponding to the defective portion 3. Thus, the portion of the organic EL display panel 100 becomes a non-light-emission area. The insulative material contained in the insulative film 4 may, for example, be acrylic resin, polyimide resin, fluorine-containing resin, epoxy resin, or styrene resin.

Here, it should be noted that the insulative film 4 need not be disposed directly on the defective portion 3. For example, the insulative film 4 may be disposed on the hole injection layer 13, or more specifically, on a portion of the hole injection layer 13 located above the defective portion 3. The insulative layer 4 shall be described in further detail later in the present disclosure.

Further, although FIG. 3 provides illustration of an organic EL element 10 having the defective portion 3, not all of the organic EL elements 10 included in the organic EL display panel 100 have the defective portion 3. That is, in actuality, only few of the organic EL elements 10 included in the organic EL display panel 100 have the defective portion 3, and there may also be cases where none of the organic EL elements 10 included in the organic EL display panel 100 have the defective portion 3. When the ratio of organic EL elements 10 having the defective portion 3 to the total number of organic EL elements 10 equals or exceeds a predetermined ratio in the organic EL display panel 100, the organic EL display panel 100 is disposed of for being defective.

1.3 Method of Manufacturing Organic EL Display Panel

Figure 4:
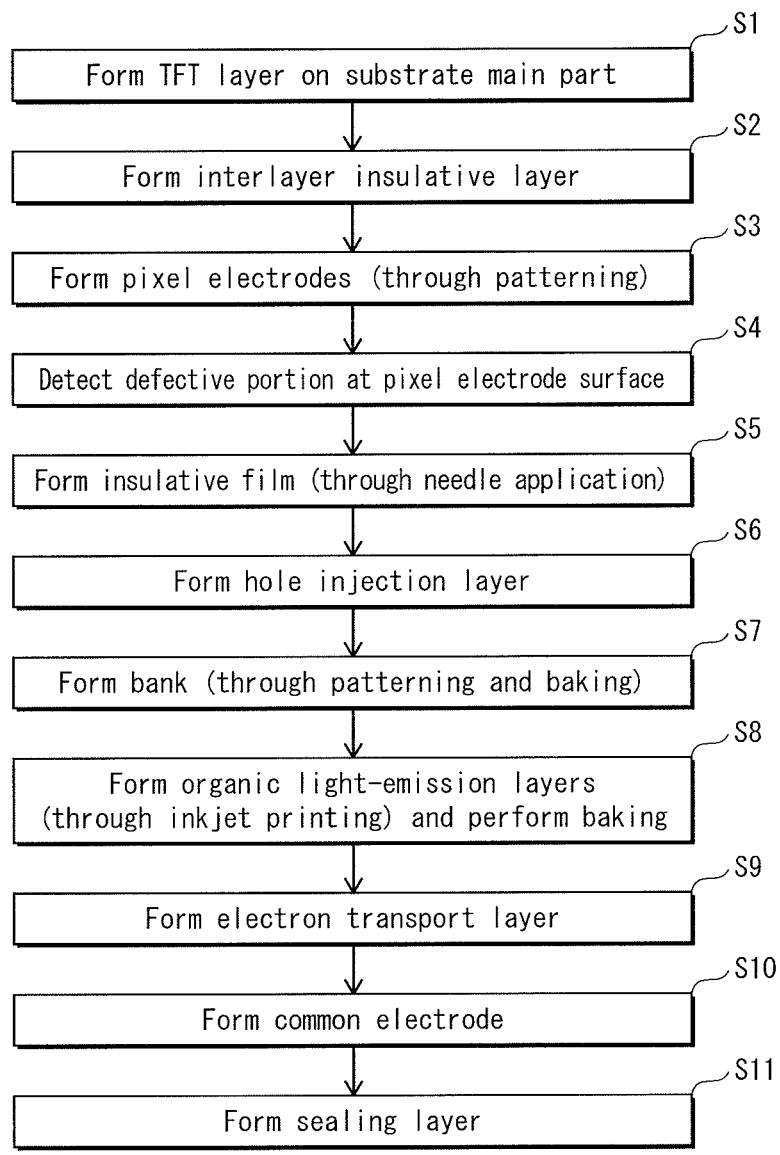
FIG. 4 is a schematic process chart illustrating manufacturing of organic EL display panel including organic EL element pertaining to embodiment 1.

The following describes a method of manufacturing the organic EL display panel 100 pertaining to one aspect of the present disclosure, with reference to FIG. 4, FIGS. 5A-5D, and FIGS. 6A-6D. As already described above, the organic EL display panel 100 includes the organic EL element 10. FIG. 4 is a schematic process chart illustrating the manufacturing of the organic EL display panel 100. FIGS. 5A-5D and FIGS. 6A-6D are partial cross-sectional views schematically illustrating the manufacturing of the organic EL display panel 100.

First, the TFT layers 11b are formed on the substrate main part 11a (Step S1 in FIG. 4).

Subsequently, the interlayer insulative layer 11c is formed on the TFT layers 11b (Step S2 in FIG. 4). Thus, the base substrate 11 is yielded. The forming of the interlayer insulative layer 11c is performed by using organic material having excellent insulative characteristics and through a process involving the use of photoresist. Further, the interlayer insulative layer 11c is formed to have a thickness of around 4 μm.

Note that although not depicted in any of the cross-sectional views (FIG. 3, FIGS. 5A-5D, FIGS. 6A-6D) or the process chart in FIG. 4, contact holes 2 (illustrated in FIG. 2) are formed in the interlayer insulative layer 11c. In specific, the contact holes 2 are formed at areas between the openings 14a (i.e., between areas where the openings 14a are to be later formed). The contact holes 2 are formed through exposure by using a pattern and developing performed subsequent to the exposure.

Figure 5A:
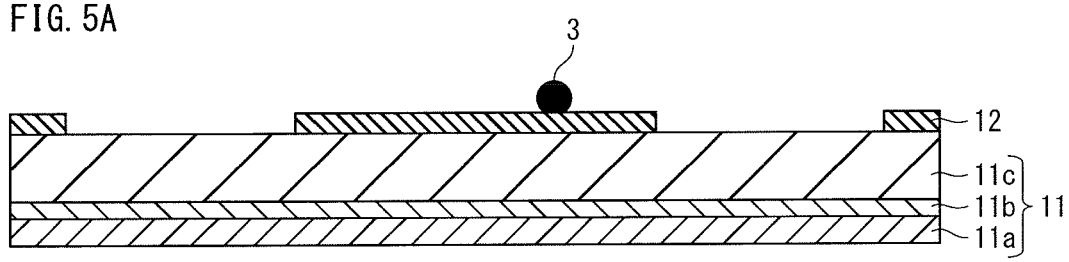
FIGS. 5A through 5D are schematic cross-sectional views illustrating a former part of manufacturing of display panel pertaining to embodiment 1, with FIG. 5A illustrating state where pixel electrode has been disposed on base substrate, FIG. 5B illustrating state where insulative film has been disposed to cover defective portion on pixel electrode, FIG. 5C illustrating state where hole injection layer has been disposed on pixel electrode and defective portion covered with insulative film, and FIG. 5D illustrating state where bank has been disposed on hole injection layer.
Figure 5B:
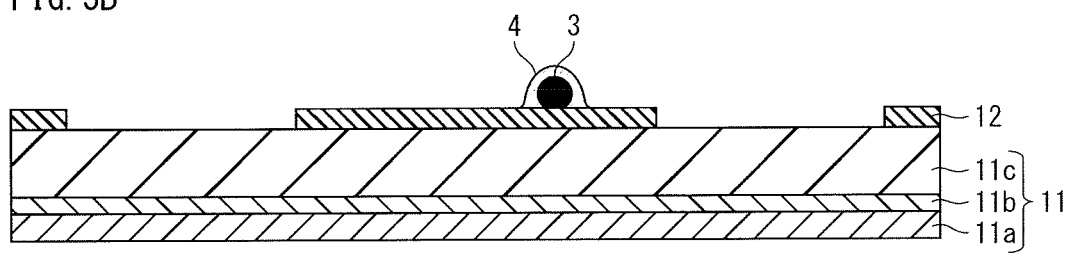

Next, as illustrated in FIG. 5A, the pixel electrodes 12 are formed on the base substrate 11 (Step S3 in FIG. 4). The pixel electrodes 12 are formed by using metal material and through vapor deposition or sputtering. The pixel electrodes 12 are formed to have a thickness of around 400 nm, and one pixel electrode 12 is formed for each sub-pixel of the organic EL display panel 100.

Then, detection of defective portions is performed, whereby the defective portion 3 at the surface of a pixel electrode 12 is detected (Step S4 in FIG. 4). For example, the detection of defective portions is performed by using a pattern inspector. A pattern inspector detects the defective portion 3 by sequentially comparing adjacent pairs of sub-pixels (organic EL elements 10) in the matrix of sub-pixels, and thereby detecting differences between the sub-pixels. When the pattern inspector detects the defective portion 3, coordinate data of the defective portion 3 is stored to an undepicted storage unit.

Subsequently, the insulative film 4 is formed with respect to the defective portion 3. The forming of the insulative film 4 is performed by applying a mixture containing a solvent and functional material over the defective portion 3 through needle application. The mixture can be accurately applied over the defective portion 3, because the coordinate data described above is input to an application device used for the application of the mixture and the application of the mixture is performed based on the coordinate data.

Here, it should be noted that the mixture, which is in a fluid state before the application, forms a film of a solid state after the application. This is because the solvent evaporates from the applied mixture, and thus, the concentration of the insulative material, which is the solid content in the mixture, increases.

In the present embodiment, the solvent contained in the mixture is, for example, DPMA (N-[2-(3,5-dimethoxyphenyl)-2-(2-methylphenyl)ethyl]adenosine, N-[2-(3,5-dimethoxyphenyl)-2-(o-tolyl)ethyl]adenosine, N-[2-(2-methylphenyl)-2-(3,5-dimethoxyphenyl)ethyl]adenosine), cyclohexanol, 2-octanol, or 1-octanol.

Further, in the present embodiment, the insulative material contained in the mixture is, for example, a monomer or an olygomer that undergoes cross-linking and polymerization. Due to this, when heating (baking) is performed in a process carried out after the mixture application process (for example, the bank forming process or the organic light-emission layer forming process), the insulative material undergoes cross-linking. Thus, an insulative film 4 having stable physical property is formed. Detailed description concerning this point is provided later in the present disclosure.

Further, in a strict sense, the forming of the insulative film 4 is completed when the cross-linking described above takes place as a result of heating. Nevertheless, in Step S5 in FIG. 4 and FIGS. 5B and 5C, it is regarded that the insulative film 4 is formed when the solvent evaporates from the mixture having been applied over the defective portion 3 to a certain extent and the applied mixture becomes physically stable to a certain extent (when the applied mixture solidifies to a certain extent).

Figure 5C:
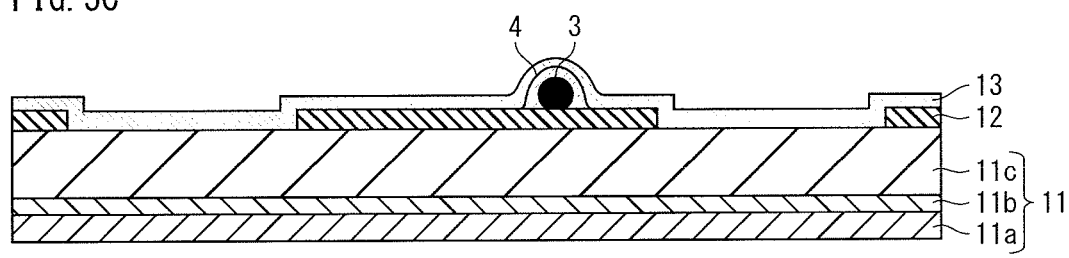

Following this, as illustrated in FIG. 5C, the hole injection layer 13 is formed to extend continuously over the base substrate 11 and the pixel electrodes 12 (Step S6 in FIG. 4). The hole injection layer 13 is formed by using tungsten oxide and through sputtering.

Figure 5D:
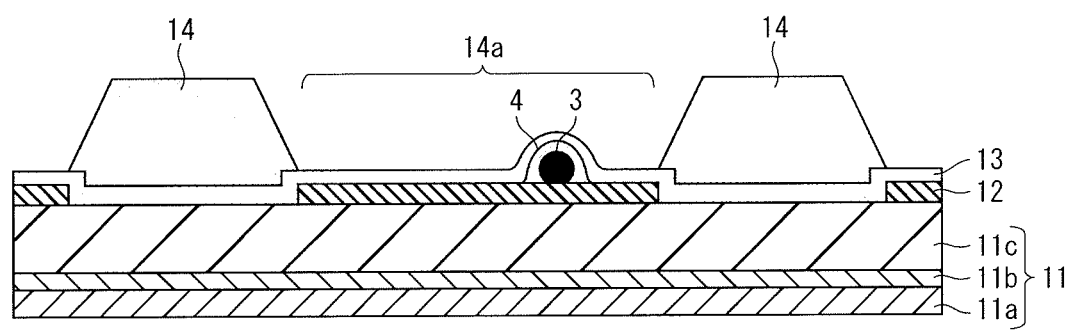

Then, as illustrated in FIG. 5D, the bank 14 is formed through photolithography. In specific, the forming of the bank 14 is performed as follows. First, a paste of bank material containing photosensitive resist is prepared, as the material for forming the bank 14. Then, the bank material is uniformly applied onto the hole injection layer 13. Subsequently, a mask formed to have the pattern of the openings 14a illustrated in FIG. 2 is placed over the bank material so applied. Then, the bank material is exposed to light via the mask, whereby a bank pattern is formed. Following this, excess bank material is washed off with an aqueous or non-aqueous etchant (developing liquid). This completes the patterning of the bank material, and baking (heating) is performed subsequently. The baking is performed, for example, for a time period of 60 minutes at a temperature of at least 150 degrees Celsius and at most 210 degrees Celsius. Thus, the forming of the bank 14, which defines the openings 14a at which organic light-emission layers are to be formed, is completed (Step S7 in FIG. 4).

Note that in the forming of the bank 14, surface treatment or plasma treatment may be additionally performed with respect to the surfaces of the bank 14. Such treatment is performed to adjust the contact angle between the bank 14 and the ink (solution) to be applied to the openings 14a, or to provide the surfaces of the bank 14 with liquid-repellency. Here, the surface treatment refers to treating the surfaces of the bank 14 by using, for example, a predetermined alkaline solution, water, or an organic solvent.

Figure 6A:
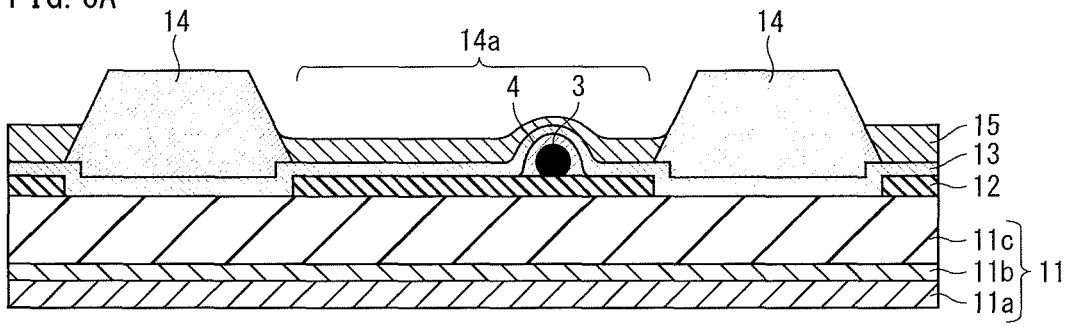
FIGS. 6A through 6D are schematic cross-sectional views illustrating a latter part of manufacturing of display panel pertaining to embodiment 1, with FIG. 6A illustrating state where organic light-emission layer has been disposed within opening, FIG. 6B illustrating state where electron transport layer has been disposed on bank and organic light-emission layer, FIG. 6C illustrating state where common electrode has been disposed on electron transport layer, and FIG. 6D illustrating state where sealing layer has been disposed on common electrode.

Following this, as illustrated in FIG. 6A, the organic light-emission layers 15 are formed by applying organic light-emission layer ink with respect to the openings 14a through inkjet printing, causing ink solvent to evaporate through drying, and performing heating/baking as necessary (Step S8 in FIG. 4). The ink is prepared by mixing, at a predetermined ratio, the organic material for forming the organic light-emission layers 15 and a solvent.

Figure 6B:
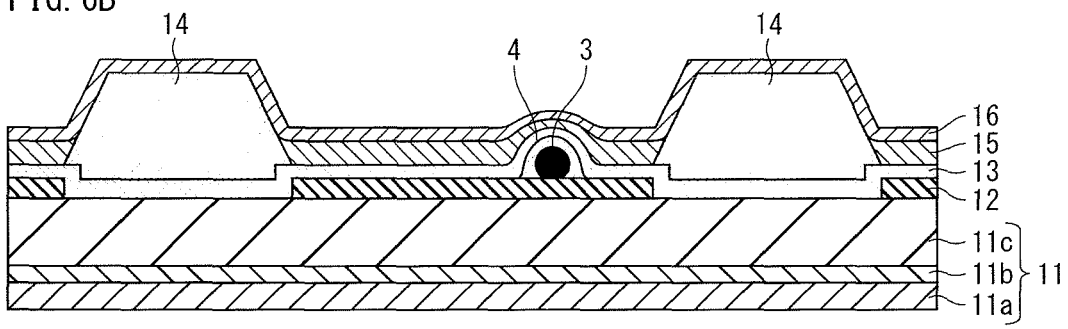

Subsequently, as illustrated in FIG. 6B, the electron transport layer 16 is formed on the organic light-emission layers 15 and the bank 14 (Step S9 in FIG. 4). The forming of the electron transport layer 16 is performed through vacuum vapor deposition.

Figure 6C:
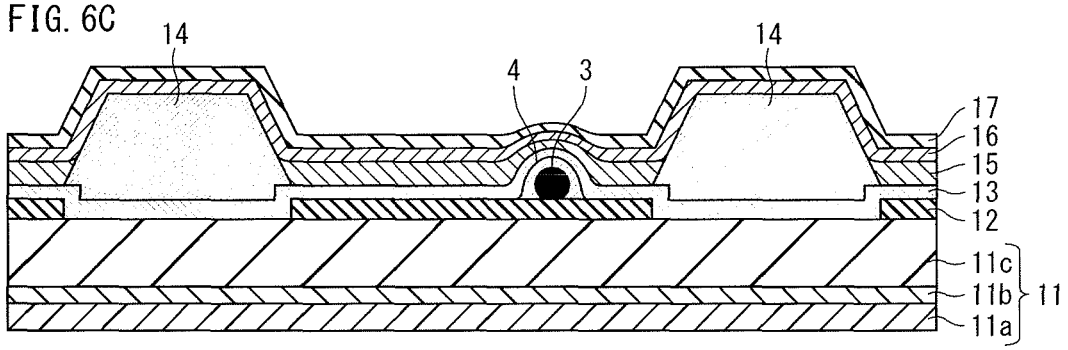
Figure 6D:
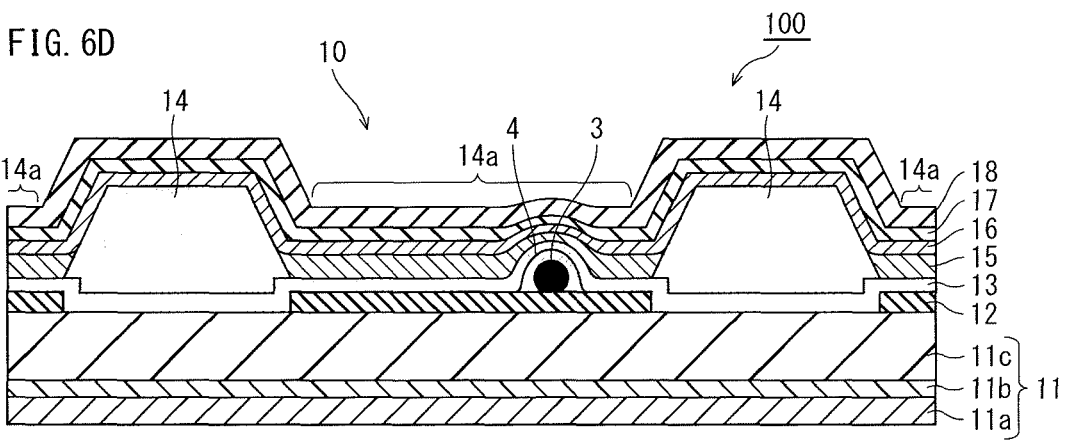

Then, as illustrated in FIG. 6C, a film of material such as ITO or IZO is formed through vacuum vapor deposition, sputtering, or the like. Thus, the common electrode 17 is formed (Step S10 in FIG. 4).

Finally, a film of light-transmissive material such as SiN or SiON is formed on the surface of the common electrode 17 through sputtering, CVD, or the like. Thus, the sealing layer 18 is formed (Step S11 in FIG. 4).

The organic EL display panel 100 is manufactured through the above procedures.

1-4. Covering Method of Covering Defective Portion

The following describes, as one aspect of the present disclosure, a covering method for covering a defective portion of an organic EL element. Note that the following describes, as one example of such covering method, a covering method applied to the organic EL display panel 100 pertaining to embodiment 1.

Figure 7A:
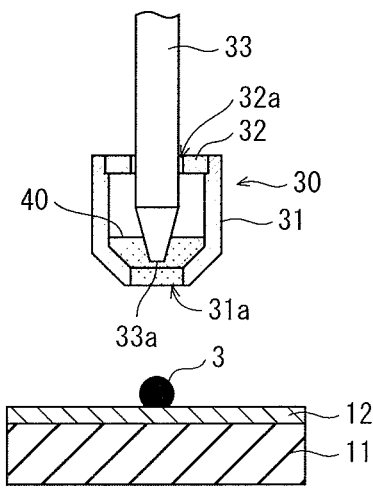
FIGS. 7A through 7C are schematic cross-sectional views illustrating covering method pertaining to embodiment 1, with FIG. 7A illustrating state before mixture is applied with respect to defective portion, FIG. 7B illustrating state where tip portion of needle is in contact with defective portion, and FIG. 7C illustrating state where defective portion has been covered with mixture.
Figure 7B:
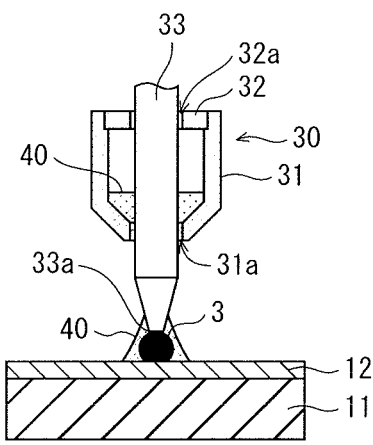
Figure 7C:
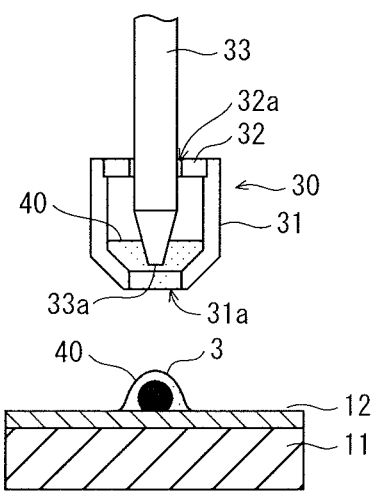

FIGS. 7A-7C are cross-sectional views schematically illustrating an overview of the covering method in the present embodiment. FIG. 7A illustrates a state before a mixture 40 is applied with respect to the defective portion 3. FIG. 7B illustrates a state where a tip portion 33a of a needle 33 is in contact with the defective portion 3. FIG. 7C illustrates a state where the tip portion 33a of the needle 33 has been moved away from the defective portion 3 and the defective portion 3 has been covered with the mixture 40.

An application part 30 in the present embodiment has the same structure as the "application part 10" in Patent Literature 2. That is, as illustrated in FIGS. 7A-7C, the application part 30 includes a container 31, a cover 32, and a needle 33.

The container 31 has a first hole 31a at the bottom thereof. The container 31 contains the mixture 40. The container 31 has an opening at the top thereof, which is covered by the cover 32. The cover 32 has a second hole 32a at the center thereof. The tip portion 33a of the needle 33 is tapered, such that the cross-sectional area of the tip portion 33a decreases as approaching the front edge of the needle 33. The needle 33 has a circular, planar surface at the front edge thereof.

Note that FIGS. 7A-7C illustrate cross-sections of objects appearing therein, with the exception of the needle 33.

The needle 33 has a diameter substantially the same as the diameter of the first hole 31a and the diameter of the second hole 32a. The tip portion 33a of the needle 33 is put through the second hole 32a and dipped into the mixture 40. The diameters of the first hole 31a and the second hole 32a, being slightly greater than that of the needle 33 passing therethrough, nonetheless are extremely small. Due to this, and also due to the surface tension of the mixture 40 and the liquid-repellency of the container 31, the mixture 40 hardly leaks out from the first hole 31a. For example, the first hole 31a may have a diameter of 1 mm or smaller.

The needle 33 is supported by an undepicted straight linear motion bearing and is movable up and down. When the tip portion 33a of the needle 33 is put in contact with the defective portion 3, the defective portion 3 receives the weight of the needle 33. Note that even when attempting to move the needle 33 further downwards after the tip portion 33a of the needle 33 comes in contact with the defective portion 3, the needle 33 does not move further downwards but withdraws upwards to avoid damage to the tip portion 33a.

The container 31 has a tapered shape such that the transverse area thereof decreases as approaching the first hole 31a. Due to this, even when the mixture 40 inside the container 31 is of a small amount, the tip portion 33a of the needle 33 can be dipped into the mixture 40. For example, the amount of the mixture 40 inside the container 31 may be 20 µl.

The following explains a covering process in which the defective portion 3 is covered with insulative material by the mixture 40 being applied with respect to the defective portion 3.

First, as illustrated in FIG. 7A, the tip portion 33a of the needle 33 and the defective portion 3 are arranged to face one another with a predetermined distance therebetween.

Then, as illustrated in FIG. 7B, an undepicted driving device causes the needle 33 to move downwards. As a result of the downward movement of the needle 33, the tip portion 33a of the needle 33 protrudes from the bottom of the container 33 via the first hole 31a, and the mixture 40 adhering to the tip portion 33a is applied with respect to the defective portion 3.

Subsequently, as illustrated in FIG. 7C, the undepicted driving device causes the needle 33 to retreat upwards to return to its original position. Thus, the tip portion 33a is dipped into the mixture 40 inside the container 31 once again (i.e., the tip portion 33a returns to the state illustrated in FIG. 7A). This concludes a single application session. At the point when the application is completed, the defective portion 3 is covered with the mixture 40. Then, the mixture 40 having been applied with respect to the defective portion 3 starts to spread to areas on the pixel electrode 12 around the defective portion 3. At the same time, the solvent in the mixture 40 starts to evaporate. This results in the increase of the concentration of the insulative material (solid content) in the mixture 40 and the consequent increase of viscosity of the mixture 40. The speed at which the mixture 40 spreads decreases as the viscosity of the mixture 40 increases, and in the course of time, the spreading of the mixture 40 comes to a substantial stop. Following this point, the evaporation of the solvent from the mixture 40 continues. Finally, the forming of the insulative film 4 (illustrated in FIG. 3) is completed when the solvent is caused to evaporate to a further extent and cross-linking of the insulative material takes place when the mixture 40 is heated in a later-performed process.

1-5. Test to Check Suitability as Material for Insulative Film

The portion of the organic EL element 10 that is covered with the insulative film 4 does not conduct current. As such, the portion of the organic light-emission layer 15 that corresponds in position to the insulative film 4 becomes a non-light-emission area. The larger the non-light-emission area in a sub-pixel, the lower the brightness of the sub-pixel. Thus, it is plausible that the non-light-emission area have the smallest necessary size. Meanwhile, it is plausible that the insulative film 4 be provided with a thickness sufficient to achieve electrical insulation. In view of this, it is plausible that the mixture used in the above-described method fulfill the three conditions described in the following.

First, it is plausible that the mixture does not spread too much when applied with respect to the defective portion 3.

Second, it is plausible that the mixture is such that the mixture, when applied with respect to the defective portion 3, has sufficient thickness at the point when the spreading of the mixture abates.

Third, it is plausible for the mixture to have viscosity characteristics that are suitable for application by using a needle, and to have a level of viscosity, when applied, that does not bring about problems such as stringing. Here, a mixture is considered as having viscosity characteristics suitable for needle application when viscosity of the mixture increases at a slow rate, and thus, the mixture has high stability.

A mixture with high viscosity shall satisfy the first and second conditions. Typically, the thickness of applied mixture decreases as the applied mixture spreads. Meanwhile, the higher the viscosity of the mixture, the lower the spreadability of the mixture when applied, and the smaller the decrease in the thickness of the applied mixture. To yield a mixture having high viscosity, it suffices to increase the concentration of solid content in the mixture.

However, a mixture having too high a viscosity, when applied, may bring about problems such as stringing.

Taking this into consideration, it can be considered that a mixture containing a low concentration of insulative material and thus having low viscosity but in the meantime containing a solvent having a low boiling point would not spread too much, and at the same time, would have sufficient thickness when applied. This is because when such a mixture is applied with respect to the defective portion 3, the solvent in the mixture evaporates in a relatively short period of time and the viscosity of the mixture increases accordingly.

Meanwhile, the procedure of covering defective portions 3 detected in organic EL display panels is typically performed with respect to several tens to several hundreds of panels, and thus is likely to be performed restlessly over a long period of time. Further, the amount of mixture used per one application is extremely small. Therefore, there are many cases where the mixture 40 remains in the container 31 over a long period of time. If the mixture 40 contains a solvent with a low boiling point, the solvent evaporates from the mixture 40 while the mixture 40 is in the container 31, and the viscosity of the mixture 40 increases accordingly. When the viscosity of the mixture 40 increases in such a manner, problems such as stringing occur in the application of the mixture 40. In addition, there are cases where the first hole 31a becomes clogged up with the insulative material in the mixture 40, which dries up and solidifies as the mixture 40 is kept in the container 31 for a long period of time.

Thus, it is plausible that the mixture 40 satisfy all three of the conditions described above, or in other words, it is plausible that the mixture 40 be provided with a good balance of the characteristics described above. In view of this, a test was conducted to check the suitability, as the mixture 40 for the insulative film 4, of thirteen different types of mixtures differing from one another in terms of solvent boiling point and/or solid content concentration (referred to in the following as mixture samples 1 through 13). Note that in the following, this test is referred to as an insulative film suitability test. In the insulative film suitability test, the mixture 40 (i.e., each of the mixture samples 1 through 13) was applied with respect to the pixel electrode 12 through needle application, and measurement based on measurement items 1 through 3 described in the following was performed with respect to the mixture 40 after application. Note that the pixel electrodes 12 used in this test did not have defective portions.

As measurement item 1, the area of the mixture 40 after application was measured, in order to assess whether or not the mixture 40 satisfied the first condition. The measurement of application area was performed by applying the sample mixture 40 with respect to the pixel electrode 12 through needle application and by measuring, in five minutes' time from the application, the diameter of the mixture 40 having spread.

As measurement item 2, film thickness of the mixture 40 after application was measured, in order to assess whether or not the mixture 40 satisfied the second condition. The measurement of film thickness was performed by applying the mixture 40 with respect to the pixel electrode 12 through needle application and by measuring, in five minutes' time from the application, the film thickness of the mixture 40 having spread.

As measurement item 3, stability of the mixture 40 after application was measured, in order to assess whether or not the mixture 40 satisfied the third condition. The measurement of stability was performed by carrying out the measurement of film thickness described above at regular intervals (once every thirty minutes in the test in the present embodiment) and measuring the amount of time it took until film thickness became 1.1 times the film thickness upon initial measurement.

The results of the insulative film suitability test, which involved measurement of the three measurement items described above, are described in the table in FIG. 8A. Assessment of application area was performed such that a diameter of no greater than 60 μm was assessed as being satisfactory, whereas a diameter of greater than 60 μm was assessed as being unsatisfactory. Assessment was performed in such a manner because a non-light-emission area of greater than 60 μm is visible to the human eye.

Assessment of film thickness was performed such that: a film thickness of no smaller than 40 nm was assessed as being satisfactory, whereas a film thickness of smaller than 40 nm was assessed as being unsatisfactory. Assessment was performed in such a manner because an insulation film having a film thickness of 40 nm over a planar surface can cover and insulate a foreign particle having a size of 5 µm, which is the maximum possible size of foreign particles that may occur in the manufacturing process.

Assessment of stability was performed such that a mixture sample requiring a time period of 12 hours or longer for film thickness to reach 1.1 times the initial film thickness was assessed as being satisfactory, whereas a mixture sample requiring a time period of shorter than 12 hours for film thickness to reach 1.1 times the initial film thickness was assessed as being unsatisfactory. Assessment was performed in such a manner because a 10% or greater increase in film thickness affects applicability, and the frequency of mixture replacement in a production line is at most twice a day.

Further, a mixture sample whose assessment was satisfactory for all of the three measurement items was provided with a total evaluation of satisfactory, whereas a mixture sample whose assessment was unsatisfactory for any of the three measurement items was provided with a total evaluation of unsatisfactory.

Figures 8A, 8B:
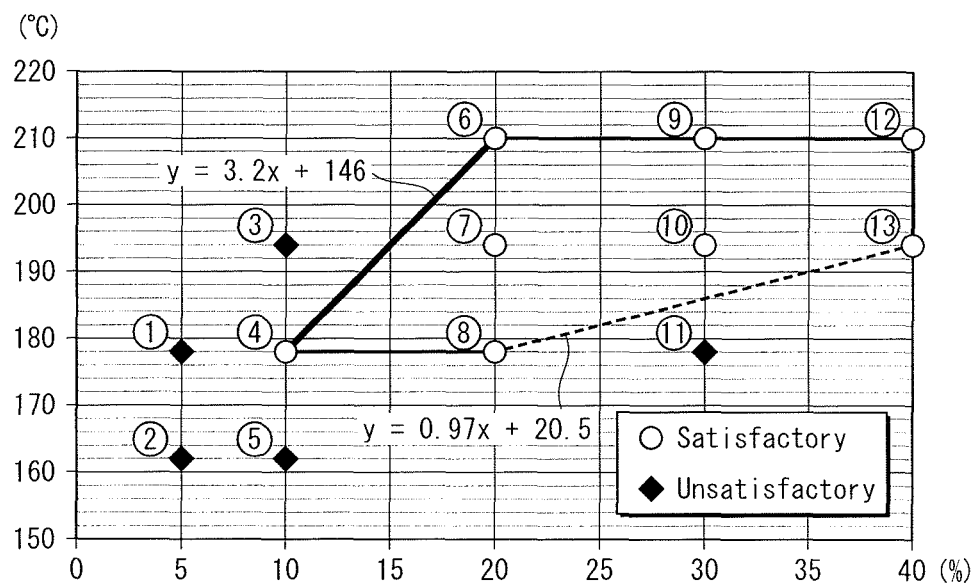
FIG. 8A is a table illustrating results of test conducted to check suitability of various mixtures as material of insulative film.
FIG. 8B is a graph that plots test results illustrated in FIG. 8A.

FIG. 8B is a diagram plotting the total evaluations of the thirteen mixture samples illustrated in FIG. 8A. In FIG. 8B, the vertical axis indicates solvent boiling point and the horizontal axis indicates solid content concentration. Further, the circled numbers in FIG. 8B indicate the respective mixture samples.

Note that the mixture samples in the insulative film suitability test contained, as the solvent, either DPMA (boiling point=210 degrees Celsius), cyclohexanol (boiling point=162 degrees Celsius), 2-octanol (boiling point=178 degrees Celsius), or 1-octanol (boiling point=194 degrees Celsius). Here, although the mixture samples used in the insulative film suitability test each contained one of such solvents, the mixture pertaining to the present disclosure may contain, as the solvent, a combination of two or more solvents. In such a case, solvent boiling point of the mixture is defined as a value calculated by (i) first multiplying, for each solvent, solvent mixture ratio and solvent boiling point, and (ii) then summing up the products of the multiplication for the two or more solvents.

Further, in the present disclosure, the concentration of solid content in the mixture is defined as the weight ratio percentage (%) of the insulative material to the solvent in the mixture.

The mixture samples in the insulative film suitability test whose total evaluation was satisfactory were located within the area surrounded by the straight lines illustrated in FIG. 8B, i.e., the straight lines connecting the mixture samples 4 and 6, 6 and 9, 9 and 12, 4 and 8, 8 and 13, and 12 and 13. Accordingly, it can be assumed that a mixture located within this area has excellent characteristics for all of the three characteristics described above, i.e., stability, film thickness, and application area.

In specific, the straight line connecting mixture samples 4 and 6 in FIG. 8B is expressible by using the mathematical expression: y=3.2x+146. Similarly, the straight dashed line connecting mixture samples 8 and 13 in FIG. 8B is expressible by using the mathematical expression: y=0.97x+20.5. As such, given x denoting solid content concentration in percentage and y denoting solvent boiling point in centigrade, the above-described area is an area surrounded by straight lines y=3.2x+146 and y=0.97x+20.5 when x is within the range $10 \leq x \leq 40$ and y is within the range $178 \leq y \leq 210$.

Embodiment 2

In embodiment 1, the defective portion 3 is a foreign particle on the pixel electrode 12. However, the defective portion 3 need not be such a foreign particle. For example, as already described in embodiment 1 in the explanation concerning the defective portion 3, an upward protrusion may be formed in the pixel electrode 12 due to a foreign particle or an upward protrusion existing lower than the pixel electrode 12, in which case the upward protrusion of the pixel electrode 12 is the defective portion 3.

In embodiment 2, description is provided on a case where the defective portion 3 is an upward protrusion of the pixel electrode 12 that is formed due to an upward protrusion formed in the surface of the interlayer insulating layer 11c.

Note that in the following, in order to avoid the repetition of description already provided in embodiment 1, constituent elements that correspond to those having been described in embodiment 1 are provided with the same reference signs and description thereon is omitted. This similarly applies to embodiment 3 and to each modification described later in the present disclosure.

Figure 9A:
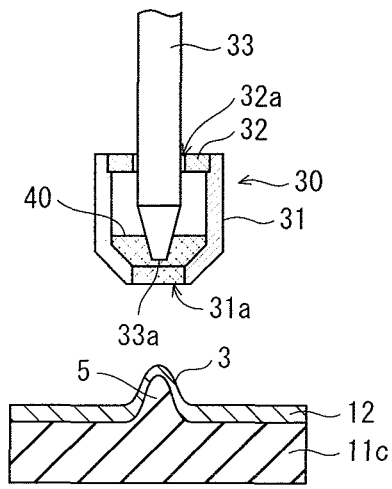
FIGS. 9A through 9C are schematic cross-sectional views illustrating covering method pertaining to embodiment 2, with FIG. 9A illustrating state before mixture is applied with respect to defective portion, FIG. 9B illustrating state where tip portion of needle is in contact with defective portion, and FIG. 9C illustrating a state where defective portion has been covered with mixture.
Figure 9B:
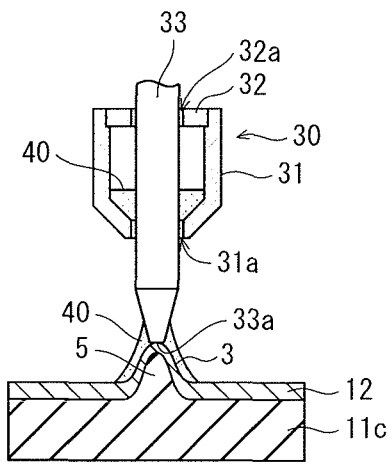
Figure 9C:
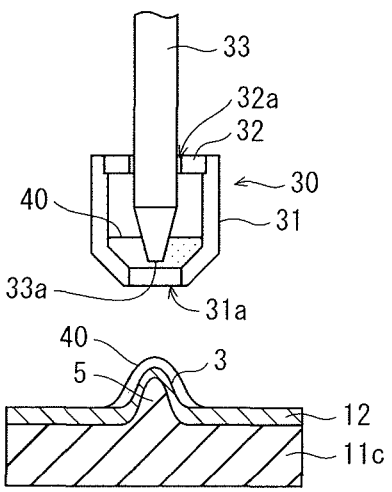

FIGS. 9A-9C are cross-sectional views schematically illustrating an overview of a covering method for covering the defective portion 3 in an organic EL element pertaining to embodiment 2. FIG. 9A illustrates a state before the mixture 40 is applied with respect to the defective portion 3. FIG. 9B illustrates a state where the tip portion 33a of the needle 33 is in contact with the defective portion 3. FIG. 9C illustrates a state where the tip portion 33a of the needle 33 has been moved away from the defective portion 3 and the defective portion 3 has been covered with the mixture 40.

As illustrated in FIGS. 9A-9C, the interlayer insulative layer 11c has a surface protrusion 5. In specific, the surface protrusion 5 is formed at the surface of the interlayer insulative layer 11c. The surface protrusion 5 is formed, for example, due to exposure in the forming of the interlayer insulative layer 11c being performed ununiformiy or due to a defect in the mask used in the forming of the interlayer insulative layer 11c. When the pixel electrode 12 is formed above the surface protrusion 5, the pixel electrode 12 is formed such that a portion thereof located above the surface protrusion 5 protrudes upwards. In the present embodiment, this upward protrusion is the defective portion 3. The defective portion 3 results in layers such as the hole injection layer 13 and the organic light-emission layer 15 above the pixel electrode 12 having ununiform film thickness or not existing at a certain portion. Thus, it is plausible that the defective portion 3 in embodiment 2 also be covered with the insulative film 4.

In embodiment 2, the covering process in which the defective portion 3 is covered with insulative material by the mixture 40 being applied with respect to the defective portion 3 is performed in a way similar to that in embodiment 1. Thus, detailed description on the covering process is not provided in the following.

As such, the insulative film 4 can be formed so as to cover the defective portion 3 in the organic EL element pertaining to embodiment 2, through needle application similar to that in embodiment 1. Further, similar to embodiment 1, it can be assumed that an insulative film 4 having excellent characteristics can be formed by using a mixture located within the area surrounded by the straight lines and the dashed lines in FIG. 8B.

Embodiment 3

In embodiment 1, the defective portion 3 is a foreign particle on the pixel electrode 12. In embodiment 2, the defective portion 3 is an upward protrusion of the pixel electrode 12 that is formed due to an upward surface protrusion existing lower the pixel electrode 12. However, the defective portion 3 need not be such a foreign particle or such an upward protrusion. For example, the defective portion 3 may be a downward protrusion.

Figure 10A:
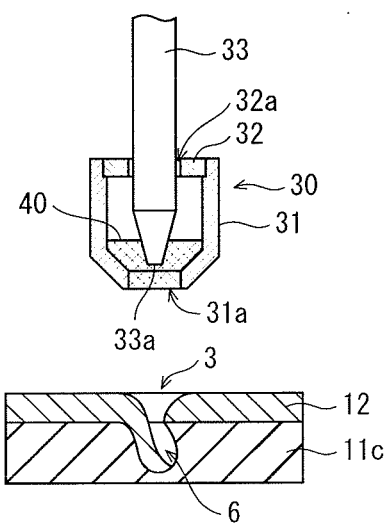
FIGS. 10A through 10C are schematic cross-sectional views illustrating covering method pertaining to embodiment 3, with FIG. 10A illustrating state before mixture is applied with respect to defective portion, FIG. 10B illustrating state where tip portion of needle is in contact with defective portion, and FIG. 10C illustrating state where defective portion has been covered with mixture.
Figure 10B:
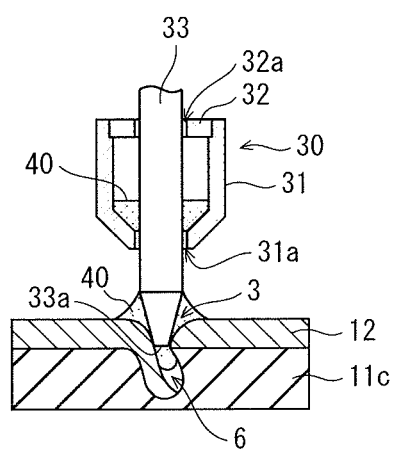
Figure 10C:
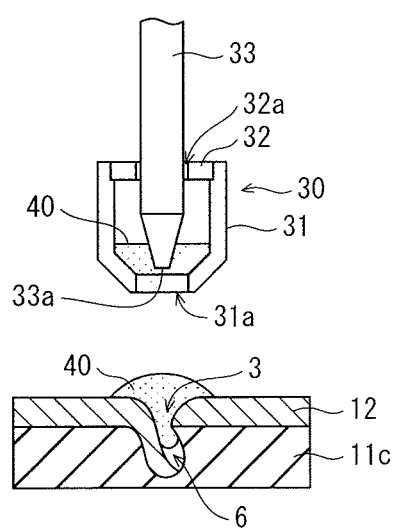

FIGS. 10A-10C are cross-sectional views schematically illustrating an overview of a covering method for covering the defective portion 3 in an organic EL element pertaining to embodiment 3. FIG. 10A illustrates a state before the mixture 40 is applied with respect to the defective portion 3. FIG. 10B illustrates a state where the tip portion 33a of the needle 33 is in contact with the defective portion 3. FIG. 10C illustrates a state where the tip portion 33a of the needle 33 has been moved away from the defective portion 3 and the defective portion 3 has been covered with the mixture 40.

As illustrated in FIGS. 10A-10C, the interlayer insulative layer 11c has a surface recess 6. In specific, the surface recess 6 is formed at the surface of the interlayer insulative layer 11c. The surface recess 6 is formed, for example, due to exposure in the forming of the interlayer insulative layer 11c being performed ununinformly or due to a defect in the mask used in the forming of the interlayer insulative layer 11c. In addition, the surface recess 6 may also be formed due to a defect in the mask used in the forming of the contact holes 2 (illustrated in FIG. 2) in the interlayer insulative layer 11c. When the pixel electrode 12 is formed above the surface recess 6, the pixel electrode 12 is formed such that a portion thereof located above the surface recess 6 protrudes downwards. In the present embodiment, this downward protrusion is the defective portion 3. In particular, when a portion of the pixel electrode 12 corresponding to an edge portion of the surface recess 6 does not exist, or that is, when a so-called discontinuity in the pixel electrode 12 is formed above the edge portion of the surface recess 6 as illustrated in FIGS. 10A-10C, the corresponding portion of the organic EL element would not have the ability to emit light. Further, when such a discontinuity is formed in the pixel electrode 12, functional layers above the pixel electrode 12 would also have similar discontinuities and/or extremely small film thickness at certain portions. When this leads to the pixel electrode 12 and the common electrode 17 being formed extremely close to one another or in contact with one another at the discontinuity portion of the organic EL element, a short circuit may be formed in the organic EL element between the pixel electrode 12 and the common electrode 17. In addition, even when the surface recess 6 does not have much depth and thus, the pixel electrode 12 is formed to be continuous along the surface of the surface recess 6, the layers above the pixel electrode 12, such as the hole injection layer 13 and the organic light-emission layer 15, would have smaller film thickness at an area above the edge portion of the surface recess 6 (i.e., the defective portion 3) than at other areas. This results in charge flowing in a concentrated manner through such area and the degradation of the area being accelerated. This may further result in forming of a non-light-emission area. Thus, it is plausible that the defective portion 3 in embodiment 3 also be covered with the insulative film 4.

In embodiment 3, the covering process in which the defective portion 3 is covered with insulative material by the mixture 40 being applied with respect to the defective portion 3 is performed in a way similar to that in embodiments 1 and 2. Thus, detailed description on the covering process is not provided in the following.

As such, the insulative film 4 can be formed so as to cover the defective portion 3 in the organic EL element pertaining to embodiment 3, through needle application similar to that in embodiments 1 and 2. Further, similar to embodiment 1, it can be assumed that an insulative film 4 having excellent characteristics can be formed by using a mixture located within the area surrounded by the straight lines and the dashed lines in FIG. 8B.

Modifications

Embodiments 1 through 3 described above are mere examples of how the technology of the present disclosure can be implemented. As such, the present disclosure shall not be construed as being limited to such embodiments. For example, the modifications described in the following can be made without departing from the spirit and the scope of the technology of the present disclosure.

(1) In the embodiments, the insulative film 4 is disposed on the pixel electrode 12. However, the technology pertaining to the present disclosure is not limited to this. For example, when the hole injection layer 13 contains an oxide of a metal such as silver (Ag), molybdenum (Mo), chromium (Cr), vanadium (V), tungsten (W), nickel (Ni), or Iridium (Ir) and is formed through sputtering, etc., the insulative film 4 may be formed on the hole injection layer 13 instead of being formed above the pixel electrode 12.

(2) It suffices that the insulative film 4 suppress the supply of holes/electrons to the portion of the organic light-emission layer 15 above the defective portion 3. As such, the insulative film 4 need not be disposed between the pixel electrode 12 and the organic light-emission layer 15. For example, the insulative film 4 may be disposed at any layer interface between the organic light-emission layer 15 and the common electrode 17. Note that provision of the insulative film 4 to any layer below the organic light-emission layer 15 may negatively affect the film thickness distribution of the organic light-emission layer 15 near end portions of the insulative film 4. However, this negative effect can be eliminated by providing the insulative film 4 to any layer above the organic light-emission layer 15.

(3) The organic EL element pertaining to one aspect of the present disclosure may further include, in addition to the layers described in the embodiments, layers such as a hole transport layer, an electron injection layer, a passivation film, and a light-transmissive electrically-conductive layer.

INDUSTRIAL APPLICABILITY

The covering method and the manufacturing method of an organic EL element, each of which pertaining to one aspect of the present disclosure, is excellently applicable, for example, as an organic EL display panel used in various display devices, television devices, displays for portable electronic devices, etc., for household use, for use in public facilities, or for business use, a manufacturing method for manufacturing such an organic EL display panel, and as a covering method for covering a defective portion of an organic EL element that may be applied in the manufacturing method.

REFERENCE SIGNS LIST 1 organic EL display device
3 defective portion
4 insulative film
5 surface protrusion
6 surface recess
10 organic EL element
11 base substrate
11a substrate main part 11b TFT layer
11c interlayer insulative layer
12 pixel electrode
13 hole injection layer
14 bank
14a opening
15 organic light-emission layer
16 electron transport layer
17 common electrode
30 application part
31 container
31a first hole
32 cover
32a second hole
33 needle
33a top portion
40 mixture
100 organic EL display panel

The invention claimed is:

1. A covering method of covering a defective portion of a body having a layer structure with insulative material, the layer structure including a pixel electrode and a common electrode, the covering method comprising:
preparing a mixture containing the insulative material and a solvent, the insulative material being one of a monomer and an oligomer configured to undergo cross-linking;
applying the mixture over the defective portion, the defective portion being one of: a downward protrusion that is formed in an upper surface of the pixel electrode in a forming process of the pixel electrode; and a combination of the downward protrusion in the upper surface of the pixel electrode and a plurality of downward protrusions each formed in a different functional layer of the layer structure due to a presence of the downward protrusion in the upper surface of the pixel electrode;
covering the defective portion with the insulative material by causing the solvent to evaporate from the mixture; and
heating the insulative material after causing the solvent to evaporate from the mixture to cause the insulative material to undergo the cross-linking, wherein
the solvent has a boiling point no lower than 178 degrees Celsius, and in the mixture, a weight ratio percentage of the insulative material to the solvent is no lower than 10%.

2. The covering method of claim 1, wherein
the boiling point of the solvent is no higher than 210 degrees Celsius, and
the weight ratio percentage of the insulative material to the solvent is no higher than 40%.

3. The covering method of claim 2, wherein
given x denoting the weight ratio percentage of the insulative material to the solvent and y denoting the boiling point of the solvent in centigrade,
x and y satisfy $10 \leq x \leq 20$, $178 \leq y \leq 210$, $y \leq 3.2x+146$, and $y \geq 0.97x+20.5$ in the mixture.

4. The covering method of claim 1, wherein
in the preparing of the mixture, the mixture is loaded to a container having an opening, and
in the applying of the mixture, after inserting an application member having a bar shape into the container through the opening, a tip portion of the application member is put in contact with the defective portion to apply the mixture with respect to the defective portion, the mixture adhering to the tip portion of the application member when the application member is inserted into the container through the opening.

5. The covering method of claim 1, wherein
the body having the layer structure is an organic EL element including:
a base substrate;
the pixel electrode disposed on the base substrate;
two or more functional layers disposed on or above the pixel electrode; and
the common electrode disposed on or above the functional layers.

6. The covering method of claim 1, further comprising:
forming a bank on a functional layer of the layer structure, the bank defining an opening in which an organic light-emission layer is to be formed, the heating being performed during the forming of the bank.

7. A manufacturing method of manufacturing an organic EL element that includes: a base substrate; a pixel electrode disposed on the base substrate; two or more functional layers disposed on or above the pixel electrode; and a common electrode disposed on or above the functional layers, the manufacturing method comprising:
forming a pixel electrode;
detecting a defective portion, the detecting performed at any point after the forming of the pixel electrode and before the common electrode is formed, the defective portion being one of: a downward protrusion that is formed in an upper surface of the pixel electrode in the forming of the pixel electrode; and a combination of the downward protrusion in the upper surface of the pixel electrode and a plurality of downward protrusions each formed in a different one of the functional layers due to a presence of the downward protrusion in the upper surface of the pixel electrode; and
covering the defective portion detected through the detecting with insulative material, the covering performed before forming one of the functional layers or before forming the common electrode, wherein
the covering includes:
preparing a mixture containing the insulative material and a solvent, the insulative material being one of a monomer and an oligomer configured to undergo cross-linking;
applying the mixture over the defective portion;
covering the defective portion with the insulative material by causing the solvent to evaporate from the mixture; and
heating the insulative material after causing the solvent to evaporate from the mixture to cause the insulative material to undergo the cross-linking, and
the solvent has a boiling point no lower than 178 degrees Celsius, and in the mixture, a weight ratio percentage of the insulative material to the solvent is no lower than 10%.

8. The manufacturing method of claim 7, wherein
the defective portion is located on the pixel electrode.

9. The manufacturing method of claim 7, further comprising:
forming a bank on one of the functional layers, the bank defining an opening in which an organic light-emission layer is to be formed, the heating being performed during the forming of the bank.

* * * * *